United States Patent
McConaghy et al.

(10) Patent No.: US 7,707,533 B2
(45) Date of Patent: Apr. 27, 2010

(54) DATA-MINING-BASED KNOWLEDGE EXTRACTION AND VISUALIZATION OF ANALOG/MIXED-SIGNAL/CUSTOM DIGITAL CIRCUIT DESIGN FLOW

(75) Inventors: Trent Lorne McConaghy, Beatty (CA); Amit Gupta, Edmonton (CA); Kristopher Breen, Saskatoon (CA); Charles Cazabon, Regina (CA); Shawn Rusaw, Saskatoon (CA); Jeffrey Dyck, Saskatoon (CA); Jason Coutu, Saskatoon (CA); Joel Cooper, Saskatoon (CA); Jiandong Ge, Saskatoon (CA); David Callele, Saskatoon (CA)

(73) Assignee: Solido Design Automation Inc., Saskatoon, Saskatchewan (CA)

( * ) Notice: Subject to any disclaimer, the term of this patent is extended or adjusted under 35 U.S.C. 154(b) by 296 days.

(21) Appl. No.: 11/780,744

(22) Filed: Jul. 20, 2007

(65) Prior Publication Data

US 2008/0022232 A1    Jan. 24, 2008

Related U.S. Application Data

(60) Provisional application No. 60/807,994, filed on Jul. 21, 2006.

(51) Int. Cl.
*G06F 17/50* (2006.01)

(52) U.S. Cl. .................. 716/11; 716/8; 716/9; 716/10; 703/2; 703/14; 707/10

(58) Field of Classification Search ............. 716/8–11; 703/2, 14; 707/10
See application file for complete search history.

(56) References Cited

U.S. PATENT DOCUMENTS

| | | | | |
|---|---|---|---|---|
| 5,043,920 | A  * | 8/1991 | Malm et al. ................ | 345/419 |
| 6,272,449 | B1 * | 8/2001 | Passera ...................... | 703/2 |
| 6,356,861 | B1 * | 3/2002 | Singhal et al. .............. | 703/2 |
| 6,671,818 | B1 * | 12/2003 | Mikurak ..................... | 714/4 |
| 7,003,745 | B2 * | 2/2006 | Subasic et al. .............. | 716/4 |
| 7,007,251 | B2 * | 2/2006 | Hekmatpour ................ | 716/4 |
| 7,024,419 | B1 * | 4/2006 | Klenk et al. ............... | 707/102 |
| 7,069,104 | B2 * | 6/2006 | Suzuki et al. .............. | 700/121 |
| 7,131,076 | B2 * | 10/2006 | Sherstyuk et al. .......... | 716/2 |
| 7,490,085 | B2 * | 2/2009 | Walker et al. .............. | 707/10 |
| 7,516,423 | B2 * | 4/2009 | De Smedt et al. .......... | 716/1 |
| 2004/0243962 | A1 * | 12/2004 | Subasic et al. .............. | 716/10 |
| 2006/0282236 | A1 * | 12/2006 | Wistmuller ................. | 703/2 |
| 2008/0005713 | A1 * | 1/2008 | Singh et al. ................ | 716/11 |
| 2008/0015827 | A1 * | 1/2008 | Tryon et al. ................ | 703/2 |
| 2008/0022251 | A1 * | 1/2008 | McConaghy et al. ........ | 716/11 |

(Continued)

OTHER PUBLICATIONS

Simula et al., "Analysis of industrial systems using the self-organizing map", 1998 Second International Conference on Knowledge-Based Intelligent Electronic System, Apr. 21-23, 1998, Adelaide, Australia.*

(Continued)

*Primary Examiner*—Naum B Levin
(74) *Attorney, Agent, or Firm*—Anne Kinsman; Borden Ladner Gervais LLP

(57) ABSTRACT

A system and method of generating a set of circuit simulation data, applying data mining to for knowledge extraction from the data, and graphically presenting the extracted knowledge in a format that is easy to digest to a designer.

11 Claims, 12 Drawing Sheets

U.S. PATENT DOCUMENTS

2008/0114564 A1* 5/2008 Ihara .................. 702/158

OTHER PUBLICATIONS

G. Gielen et al., "Computer Aided Design of Analog and Mixed-Signal Integrated Circuits", Proceedings Of The IEEE, Dec. 2000, vol. 88, No. 12, pp. 1825-1852.

William Frawley et al., "Knowledge Discovery in Databases: An Overview", AI Magazine, ISSN 0738-4602, Fall 1992, pp. 213-228.

"What is Process Capability", NIST/SEMATECH e-handbook of Statistical Methods, http://www.itl.nist.gov/div898/handbook/pmc/section1/pmc16.htm, Jul. 18, 2006, sec. 6.16.

Georges G. E. Gielen et al., "Techniques and Applications Of Symbolic Analysis For Analog Integrated Circuits: A Tutorial Overview", Computer Aided Design of Analog Integrated Circuits and Systems, IEEE Press, 2002, pp. 245-261.

Hongzhou Liu et al., "Remembrance of Circuits Past: Macromodeling by Data Mining in Large Analog Design Spaces", Proc. DAC 02, Jun. 2002, pp. 437-442.

Glenn Wolfe et al., "Extraction and Use of Neural Network Models in Automated Synthesis of Operational Amplifiers", IEEE Transactions On Computer Aided Design Of Integrated Circuits and Systems, Feb. 2003, vol. 22, No. 2, pp. 198-212.

P. Vancorenland et al., "A Layout-aware Synthesis Methodology for RF Circuits", Proc. ICCAD 01, Nov. 2001, pp. 358-362.

Walter Daems et al., "Simulation-Based Generation of Posynomial Performance Models for the Sizing of Analog Integrated Circuits", IEEE Transactions On Computer Aided Design of Integrated Circuits and Systems, Feb. 2003, vol. 22, No. 5, pp. 517-534.

F. De Bernardinis et al., "Support Vector Machines for Analog Circuit Performance Representation", Proc. DAC 03, Jun. 2003, pp. 964-969.

Tholom Kiely et al. "Performance Modeling of Analog Integrated Circuits using Least-Squares Support Vector Machines", Proceedings of the Design, Automation and Test in Europe Conference and Exhibition (DATE'04), Mar. 2004.

Glenn Wolfe et al., "Adaptive Sampling and Modeling of Analog Circuit Performance Parameters with Pseudo-Cubic Splines", Proc. ICCAD 04, Nov. 2004, pp. 931-938.

Mengmeng Ding et al., "A Two-Level Modeling Approach to Analog Circuit Performance Macromodeling", Proceedings of the Design, Automation and Test in Europe Conference and Exhibition (DATE'05), 2005, pp. 1088-1089.

Xin Li et al., "Robust Analog/RF Circuit Design with Projection-Based Posynomial Modeling", Proc. ICCAD, 2004, pp. 855-862.

Leo Breiman, "Stacked Regression", Machine Learning, vol. 24, 1996, pp. 49-64.

Jerome H. Friedman, "Multivariate Adaptive Regression Splines", The Annals of Statistic, vol. 19, No. 1, Mar. 1991, pp. 1-141.

Harris Drucker et al., "Support Vector Regression Machines", Adv. in Neural Information Processing Systems, vol. 9, 1997, pp. 155-161.

William H. E. Day et al., "Efficient Algorithms for Agglomerative Hierarchical Clustering Methods", Journal Of Classification, vol. 1, No. 1, Dec. 1984, pp. 7-24.

"Data Mining", Wikipedia, the free encyclopedia, http://en.wikipedia.org/wiki/Data_mining, Sep. 27, 2007.

* cited by examiner

DATA-MINING-BASED KNOWLEDGE EXTRACTION AND VISUALIZATION OF ANALOG/MIXED-SIGNAL/CUSTOM DIGITAL CIRCUIT DESIGN FLOW

This application claims the benefit of priority of U.S. Provisional Patent Application No. 60/807,994 filed Jul. 21, 2006, which is incorporated herein by reference. The applicant acknowledges the participation of K.U. Leuven Research and Development in the development of this invention.

FIELD OF THE INVENTION

The present invention relates generally to design tools for improving performances and/or yield in semiconductor circuits. More particularly, the present invention relates to design tools using data mining based knowledge extraction and visual display of the extracted information.

BACKGROUND OF THE INVENTION

Software tools are frequently used in the design of analog, mixed-signal and custom digital circuits. In front-end design for yield, designers choose device sizes such that the maximum possible percentage of manufactured chips meets all specifications (i.e., such the yield is maximized). The designer may have aims to improve performance as well (i.e. have more aggressive specifications). In order to effectively design such circuits, designers need insight into the design. Specifically, the designers need insight into how topology choice, device sizes, and layout affect performances and yield of the circuits in question. Current techniques to provide this insight include: examination of circuit schematics, manual derivation of modeling equations, and circuit simulation. These techniques typically divide the problem into the creation of data on which an analysis can be based, and on the visualization used to represent the data.

The data is often created using simulations making use of circuit simulation/analysis tools such as SPICE. The datasets generated can be generated in one of many possible ways. Examples of such common ways follow. The data set can be based on evaluating the performance of a single design point (e.g., device sizes), single random point (e.g., as drawn from a probability density function that approximates manufacturing variations), and single environmental point (e.g., specific setting for temperature & load). Alternatively, the data can be based on single or nested sweeps across design variables of a given circuit design to provide a better data set with which to work. A single sweep might be: sweep across a set of values $v_1, \ldots, v_i, \ldots v_N$ for a specific design variable with every other design variable fixed. Following this, a simulation is performed at {design point i, the "nominal" random point, a "typical" environmental point} to output a set waveforms and of performance values, such as measures of power consumption and gain. This provides a data set that can be used in multiple ways as will be described below. A nested sweep might be: outer sweep is across a set of values $v_1, \ldots, v_i, \ldots v_N$ for a specific design variable with every other design variable fixed; then for each design point, there is an inner sweep across a set of user-defined environmental points $p_i, \ldots, p_j, \ldots p_M$. This is followed by a simulation done at that {design point i, nominal random point, environmental point j} to obtain corresponding output performance values. Alternatively, for a given design point, a "Monte Carlo" simulation can be performed as follows: at a given design point, for each of a set or random points drawn from a probability density function, for each of a set of user defined environmental corners, simulate and extract performance values. Sensitivity analysis can also be performed about a design point, random point or environmental point by causing slight perturbations in corresponding design variables, random variables, and environmental variables respectively.

The data obtained is typically presented to the designer as either raw data or in a simple data aggregation. A more "raw" form (i.e., less-processed form) of the data might be a waveform, for example of a voltage vs. time, which would be output from a single {design point, random point, environmental point} in a transient analysis. Or, if the dataset is the result of a sweep of a design variable at N different values, then there may be N waveforms overlaid on a same plot. An example of slightly more processed data is to have a performance value (e.g., power consumption) presented as a function of a design variable, i.e., the result of a sweep across that the given design variable. The results of a nested sweep where an outer sweep has values of a design variable and an inner sweep has environmental points could be a plot of "worst case performance" versus design variable values, where "worst case performance" for a design point is the worst of all performance values across environmental points extracted for that design point. The results of a Monte Carlo simulation might be analyzed by estimating yield, as the percentage of random points that are feasible, where a random point is feasible only if all its worst-case-performances (across environmental points) met all performance specifications. Another more visual way to analyze Monte Carlo results would be in a 2d scatter plot, where each axis is for a worst-case-performance such as worst-case gain and worst-case power consumption. Then there is one point drawn on the scatter plot for each random point. Such a scatter plot is useful to visually identify correlations among performances.

These visualization methods are suitable for a small set of data, which results in a requirement to constrain the number of variables that can be adjusted, the range of the variables, and the depth of nesting. If such limitations are not imposed, the number of possible plots presented quickly becomes overwhelming for the designer. In modern designs, there are a large number of design elements where each element may have many design and random variables associated with it. This means that there can be a huge number of variables. For example, 10 random variables per device, and 100 devices, means 1000 random variables. Moreover, these variables can be nonlinearly coupled: for example, 1000 variables could have about 1,000,000 possible couplings. Despite this, the designer wants to, somehow, get insights into how to design the circuit. To try to understand the whole space of possible variables and their relations is an extremely complex task for a human Even if a dataset to describe a given could be generated via the traditional sweeps, etc., that dataset would be so huge that it would be unusable for human analysis. One possibility to provide the designer with a more compact data set is to limit the number and range of variables to be adjusted. This results in a manageable data set, and allows a certain degree of design optimization, but it requires some prior insight into which variables to limit. Therefore, the chance for optimality is lost and, there is a risk that important information will not be presented to the designer.

One problem faced by designers is that there is typically a complicated nonlinear relation from each component's design and random variables to each performance characteristic, and ultimately to yield. For example, not every component that has an effect on the performance characteristics of a design will have an effect on the yield of the manufacturing process. Without a tool to provide information identifying which elements have an effect on yield, designers may make performance-changing modifications without realizing any gain in yield.

Another problem faced by designers occurs when none of the topologies tried are able to meet target performances and yield. The designer may have even tried to apply an automated performance/yield optimizer to get the best possible designs, but to no avail. In this case, the designer may need to design a new topology. There are no industrially scalable automated topology design approaches, so topology design must be manual. Topology design requires deep insight into design and the issues related to past topologies, i.e., knowledge of why prior topologies that were tried did not work. A tool that provides information such as relative impacts of design variables and random variables on past topologies would be invaluable information to the designer as they try new topologies. Furthermore, such a tool would also be very useful in the new candidate topology designs that the designer attempts, to learn what its particular issues are.

Another problem is that the person who does the front-end design (e.g., topology selection or design, sizing) is often not the same person who does layout design. If they are different people, then the person doing the front-end design will have far more insight into the relative importance of variables/devices on performance (and to a lesser extent, yield) because that is where their training lies. But the person doing the layout design may still need to make changes, to resolve layout-related yield issues, parasitic issues, and more. Unfortunately, when they make changes to the design they may inadvertently affect the performance or the yield of the circuit, without realizing it. Further, even if they did notice the problem, they would not necessarily have the insight to know what they can and cannot change.

To improve the insight that designers have into their circuits, it would be very useful to have a mechanism to determine how much each individual device affects yield and/or performance; and to have that info across a range of design space broader than sensitivity analysis (which is by definition local). Further, a mechanism to determine the interactions between components and how they affect performance and/or yield would be very useful. It would also be very useful to know this information not only on a component-by-component basis, but also at the level of design variables (e.g., width), random variables (e.g., oxide thickness of a given device), and environmental variables (e.g., power supply voltage, load resistance, temperature, etc.).

Therefore, it is desirable to provide a tool for extracting and presenting information to a designer to convey how individual elements (devices or variables) can affect the performance and/or yield of an electrical circuit design. This desired tool should be able to perform on an element-by-element basis, or by taking into account coupling between elements. Furthermore, it is desirable to provide a general means for the designer to gain insight by extracting knowledge from circuit simulation data, including: identifying causal variable dependencies of circuit variables (and thus circuit devices too); identifying interesting clusters of circuit simulation data (e.g. clusters of metric values); reducing dimensionality into human-viewable dimensions; and visually representing the extracted knowledge.

SUMMARY OF THE INVENTION

It is an object of the present invention to obviate or mitigate at least one disadvantage of previous yield presentation techniques.

In a first aspect of the present invention, there is provided a method for visualizing data associated with an electrical circuit design (ECD), the ECD having circuit variables and circuit performance metrics. The method comprises steps of accessing a database containing circuit simulation data of the ECD, the circuit simulation data including circuit variables data and circuit performance metrics data, and of extracting circuit simulation data to obtain extracted data. The method further comprises steps of processing the extracted data in accordance with a pre-determined data-mining algorithm to obtain output data, organizing the output data in accordance with pre-determined display criteria to obtain organized data, and displaying the organized data.

The step of processing the extracted data can include forming a classification and regression tree (CART), the CART mapping at least one circuit variable to one of the circuit performance metrics. The step of accessing the database can be preceded with a step of populating the database, and the step of populating the database can be performed using SPICE simulation of the ECD.

The step of populating the database can include simulating the ECD by using Latin hypercube samples of a space of variables of the ECD.

The step of processing the extracted data can include a step of building a regression model representing a circuit performance metric as a function of at least one circuit variable. The step of building a regression model can be followed by steps of selecting input data from the circuit variables data to obtain input data, inputting the input data into the regression model to obtain an output of the regression model, and comparing the output of the regression model to circuit performance metrics data associated with the input data, to obtain a comparison value. If the comparison value is outside a pre-determined range, the steps of selecting input data, inputting the input data and comparing the output can be followed by a step of modifying the regression model in accordance with the comparison value, and be repeated until the comparison value is within the pre-determined range.

The step of processing the extracted data can include performing a step of clustering the extracted data according to a pre-determined distance metric criteria. The step of processing the extracted data can also include forming at least one of a set of classification and regression trees (CARTs) and a Bayes network.

In a second aspect of the present invention there is provided a method of calculating an impact of design variables on a yield of an electrical circuit design (ECD), the design variables being associated with the ECD. The method comprises steps of populating a database system by performing simulations of the ECD, the simulations having as input circuit variables, the circuit variables including at least one of design variables, random variables and environmental variables, the simulations having as output circuit simulation data. Further, there are steps of extracting the circuit simulation data from the database system to obtain extracted data, and of processing the extracted data in accordance with a first pre-determined data-mining algorithm to build a first set of regression models, each regression model representing a circuit performance metric as a function of at least one circuit variable. Further yet, there are steps of generating a set of design-related data points, each data point related to a distinct design, by sampling a design variable space, the design variable space containing variants of the ECD based on different combinations of design variables and, for each design-related data point, generating a set of random-variable-related data points by sampling the random variables in accordance with a pre-determined random-variable-sampling algorithm. Additionally, there are steps of, for each random-variable-related data point, generating a set of environmental-variable-related data points by sampling the environmental variable in accordance with a pre-determined environmental-variable-sampling algorithm; generating circuit performance data points by using the first set of regression models to simulate circuit performances metrics for each of the environmental-variable-related data point; calculating a yield estimate for each distinct design by aggregating the circuit performance data points across the environmental variables and random variables to produce a set of yield estimates; and processing the set yield estimates in accordance with a second pre-determined data-mining algorithm to build a second set of regression models, each regression model of the second set of regression models representing a yield as a function of at least one circuit variable. The pre-determined random-variable-sampling algorithm can be a Monte Carlo sampling algorithm.

In a third aspect of the invention there is provided a system for visualizing data associated with an electrical circuit design (ECD), the ECD having circuit variables and circuit performance metrics. The system comprises a database containing circuit simulation data of the ECD, the circuit simulation data including circuit variables data and circuit performance metrics data; a data-mining engine for extracting circuit simulation data to obtain extracted data and to process the extracted data in accordance with a pre-determined data-mining algorithm to obtain output data; a visualization tool for organizing the output data in accordance with pre-determined display criteria to obtain organized data; and a display system for displaying the organized data.

The present invention also provides a method for visualizing data associated with an electrical circuit design (ECD), the ECD having circuit variables and circuit performance metrics. The method comprises steps of accessing a database containing circuit simulation data of the ECD, the circuit simulation data including circuit variables data and circuit performance metrics data; extracting circuit simulation data to obtain extracted data; correlating the extracted data in accordance with pre-determined rules regarding the circuit variables data and the circuit performance metrics data, to obtain correlated data; and displaying the correlated data.

Additionally, the present invention provides a method of wherein processing the extracted data can includes forming at least one of a Bayes network, a Gaussian network, a kernel density model, a neural network, a fuzzy system, a set of CART trees, a combination of a set of CART basis functions and linear/polynomial basis functions, a spline, a support vector machine.

Other aspects and features of the present invention will become apparent to those ordinarily skilled in the art upon review of the following description of specific embodiments of the invention in conjunction with the accompanying figures.

BRIEF DESCRIPTION OF THE DRAWINGS

Embodiments of the present invention will now be described, by way of example only, with reference to the attached Figures, wherein.

DETAILED DESCRIPTION

Figure 1:
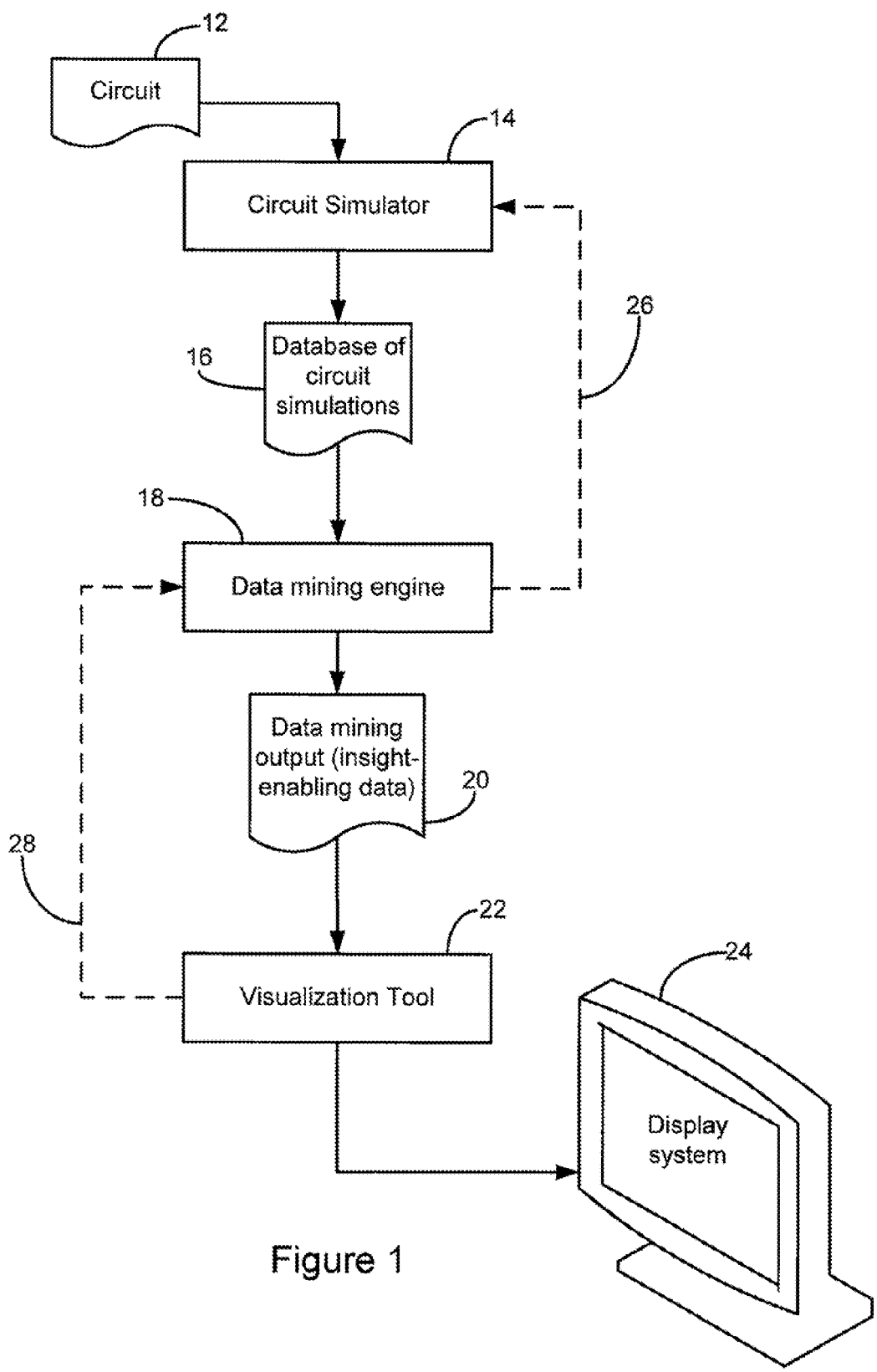
FIG. 1 is a block diagram illustrating an exemplary embodiment of the present invention.

Generally, the present invention provides a method and system for creating a set of circuit simulation data, from which insight-enabling data can be extracted using data mining techniques. The insight-enabling data is organized and presented to the designer to help him guide design choices. As will be understood by a worker skilled in the art, data mining refers to "the nontrivial extraction of implicit, previously unknown, and potentially useful information from data" [W. Frawley and G. Piatetsky-Shapiro and C. Matheus (Fall 1992). "Knowledge Discovery in Databases: An Overview". AI Magazine: pp. 213-228. ISSN 0738-4602.], and to "the science of extracting useful information from large data sets or databases [D. Hand, H. Mannila, P. Smyth (2001). Principles of Data Mining. MIT Press, Cambridge, Mass., ISBN 0-262-08290-X.]

In the following description, for purposes of explanation, numerous details are set forth in order to provide a thorough understanding of the present invention. However, it will be apparent to one skilled in the art that these specific details are not required in order to practice the present invention. In other instances, well-known electrical structures and circuits are shown in block diagram form in order not to obscure the present invention. For example, specific details are not provided as to whether the embodiments of the invention described herein are implemented as a software routine, hardware circuit, firmware, or a combination thereof.

In existing electrical circuit design systems, when data related to an electrical circuit design is retrieved from a database system, the amount of displayed data is limited in order to prevent the system from overwhelming the user with information. This results in vast quantities of what can be referred to as "hidden information" within raw data that just simple calculations and plotting cannot highlight. One example of such hidden information is the impact of variables across a whole region of design space that simple sensitivity calculations do not reveal.

There is an emerging field called data mining which specializes in taking raw data (or near-raw data), and extracting useful knowledge from it. Some of the features of existing tools include: the ability to extract the relative importance of variables given target input/output data; the ability to extract the relative importance of variable interactions; the ability to extract causal variable dependencies; the ability to identify interesting clusters of data; and the ability to reduce dimensionality of data into human-viewable dimensions (2d or 3d; for real-world datasets this requires advanced nonlinear techniques, unlike singular value decomposition). There are also related tools for visualizing and interactively exploring results of data mining that have capabilities such as: automatically generating causal variable dependency diagrams; plotting the relative importance of input variables when mapping to target output variables; plotting hierarchical decompositions of the extracted knowledge; plotting graph representations of variable dependencies; etc.

Although data mining for knowledge extraction has been used in other fields such as biology, it has not been applied to analog/mixed-signal/custom digital circuit design. This lack of application is due in large part to the difficulty in managing the resultant large data sets, and in finding a manner of presenting useful information to the designer. By making use of the processing techniques provided by the present invention, large volumes of data can mined, and presented to the designer in a compact fashion to provide immediately understandable information, such as, for example, the relative impact of design elements on yield.

Such data mining tools include, amongst others, classification and regression trees (CART) and their hierarchical visualization; bagged trees and random forests, boosted trees and the techniques to extract variable impact and variable interaction impact; Bayesian networks; and bottom-up agglomerative hierarchical clustering. Thus, data mining spans tools from statistics, machine learning, intelligent systems, and elsewhere.

The present invention provides a generalized mechanism that can be used to extract more useful information from data sets regarding electrical circuit designs and present it in a meaningful way to the designer, such that ultimately the quality of the electrical design and the effectiveness of the designer improve. This additional insight provided by the present invention helps the designer make more effective decisions in front-end design such that the performance and yield of the design can be maximal. It has a beneficial effect in the flow after front-end design as well, because the impact information and other information are valuable to the people handling layout design, proximity correction, etc. It's even useful in manufacturing because it gives visibility into the process variables, which have, for example, the most impact on yield.

Whereas the prior art made use of limited data sets and simple algebraic or statistical calculations to provide limited yield information for design elements, the present invention applies data-mining approaches to extract more insight-providing information from circuit simulation data. This information can then be presented to the designer in a manner that allows for a simple digestion of the data.

FIG. 1 shows a block diagram illustrating an embodiment of a system 10 of the present invention. The system 10 comprises an electrical circuit design (ECD) 12 that serves as input to a circuit simulator 14, which can be, for example, a SPICE circuit simulator or any other suitable type of electrical circuit simulator. A database 16 is connected to the circuit simulator 14 to receive and store simulation results therefrom. The simulation results can includes, for example, data relative to the variables of the ECD and to performance metrics of the ECD. A data-mining engine 18 is operatively connected to the database 16 to extract the simulated data and use it as input to a data-mining algorithm. As will be discussed below, several data-mining algorithms (approaches) can be implemented by the data-mining engine 18. The data-mining engine 18 produces insight-enabling data 20, also referred to as data-mining output and/or as extracted knowledge, which is provided to a visualization tool 22 that organizes the insight-enabling data for display by a display system 24.

While FIG. 1 presents a generalized view of the invention, there are many possibilities of how the invention can be embodied. There can be different circuit simulation datasets contained in the database 16, different data-mining algorithms/techniques, providing different types of extracted knowledge (insight-enabling data 20), and different ways to visualize the extracted knowledge. There is also the option for feedback from the data-mining engine 18 back to the circuit simulator 14, the feedback symbolized by the dotted line 26, which allows for insight-enabling data 20 to guide the selection of additional insight-enabling data. Feedback is also possible in the optimization techniques to leverage the capabilities of the data-mining engine 18. There is also the option for providing feedback from the visualization tool 22 to the data-mining engine 18, symbolized by the line 28, either through explicit user commands, through a user input module (not shown), or automated functions. As will be seen below, such feedback allows the user to guide the data-mining process at intermediate steps of the data-mining process.

The present invention makes use of the circuit simulator 14 to generate a set of circuit simulation data for the EDC 14. Whereas prior art solutions would constrain the volume of data created so that the simulated data set can be used by a designer without overloading him, the present invention allows the simulated data set to be exhaustive, as it serves as the data source for the data-mining engine 18. The data-mining engine 18 is used to extract information from the circuit simulation data contained in the database 16 (which is possible in conjunction with other data as well) that satisfy pre-determined rules used to determine if the data is relevant or not. Other input data can include, for example, information about the circuit topology, test harnesses to simulate a circuit and extract performance measures, strategy settings for the data mining engines, and user preferences such as maximum runtime. The extracted knowledge (insight-enabling data, correlated data 20) is then provided to the visualization tool 22 that can present the extracted data to a user in any suitable viewable format that allows for inspection.

One skilled in the art will appreciate that the data-mining engine 18 can operate iteratively with the circuit simulator 14, i.e., in a feedback configuration, to allow for adaptive data mining (also known as "active learning" and "evolutionary design of experiments") to be incorporated into the system 10. Alternatively, or in combination, following the visualization, a user may create an overall iterative loop. The presentation of data through the visualization tool can be done in parallel with the generation and analysis of data in the circuit simulator 14 and data-mining engine 18. Different data-mining methods can be executed, either serially or in parallel, by the data-mining engine 18 on a single database 16 of circuit simulations. The output of the data-mining engine 18 can be stored for later use in either other designs or for viewing by different users.

Figure 2:
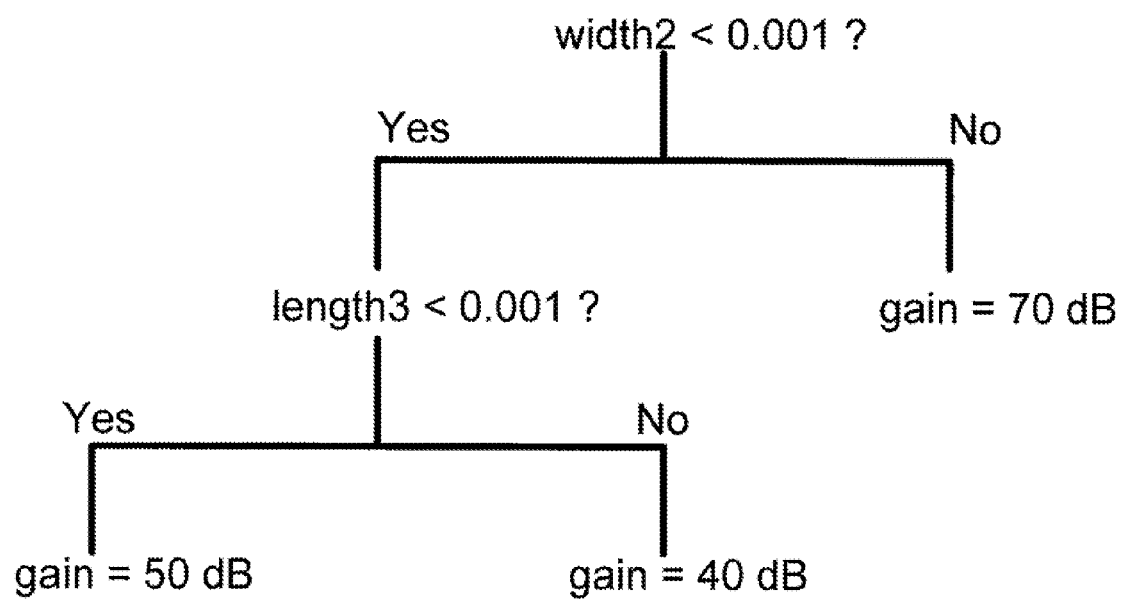
FIG. 2 shows an exemplary classification and regression tree (CART) that maps design variables to performance.

The following shows an exemplary use of the system of the present invention. For a given EDC, a set of Latin hypercube samples is taken in design variable space (such as, e.g., transistor widths and lengths), with a random variation of the design variables set to zero (i.e., a "nominal" random variation). For each sample, there are circuit simulations done for each environmental "corner", e.g., for different combinations of temperature values and load resistance values. From the output of the simulations, simple calculations are made to compute performance metrics such as power consumption, open loop gain, and bandwidth. This circuit simulation data is stored in the database 16 of FIG. 1. Then a classification and regression tree (CART tree) can be formed, mapping the ECD variable to each performance metric. The formation of the CART constitutes the data-mining phase. The tree (CART) can be binary, where each split in the tree has a "decision rule" associated with it. An example decision rule "width2<0.001", where "width2" is a variable of the ECD in question. Thus, each decision rule includes one variable, a direction, and a value associated with it. FIG. 2 illustrates an example CART tree that maps design variables width2 and length3 (which is also a variable of the ECD in question) to different values of gain, depending on the input values of width2 and length3. The highest-influence decision rules are near the top of the tree (CART), the lesser-influence rules are near the leaf nodes, and negligible and zero-influence variables can be omitted from the tree. In this example, the CART, including its structure, constitutes the data-mining-extracted knowledge, i.e., the insight-enabling data 20 (data-mining output). This insight-enabling data can then be presented graphically to the user through the display system 24. In this case it is typically depicted as a visual tree, such as depicted, for example, in FIG. 2, which can then be quickly scanned by a designer, or studied in detail.

Figure 3:
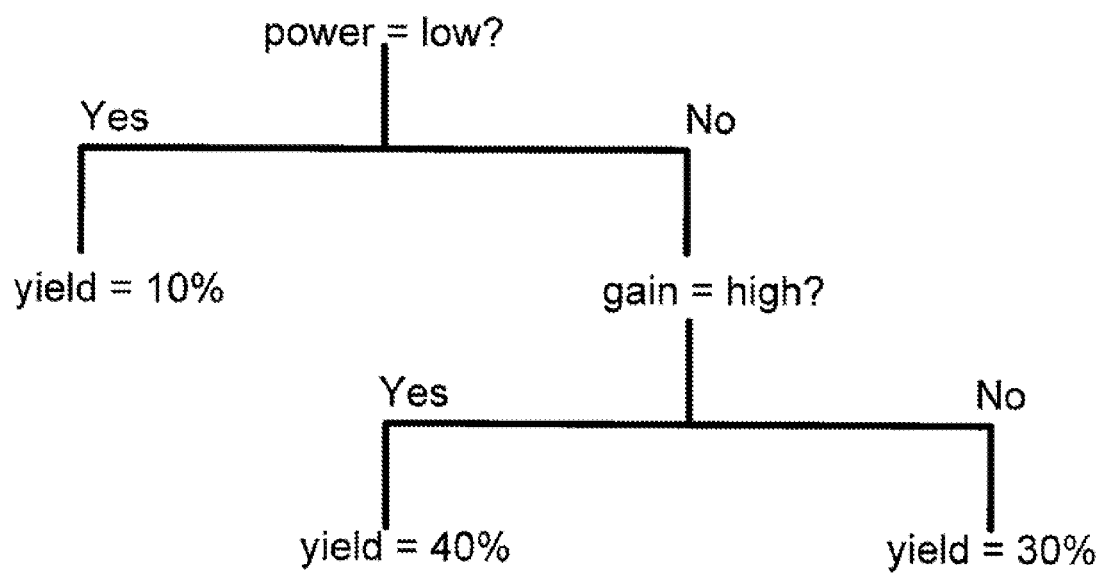
FIG. 3 shows an exemplary classification and regression tree (CART) that maps performance measures to yield.

Following is a further example use of the system 10 of the present invention. The circuit simulation data is generated via Monte Carlo sampling, i.e., for a fixed design point and a set of random points is drawn. For each random point, many environmental corners are simulated and measures of performance and gain are taken for each simulation calculated by the circuit simulator 14. This data is stored in a database 16. The data-mining engine 18 first aggregates across environmental points, then performs CART data mining. In this example, to aggregate at each random point, the worst-case gain is corresponds to the minimum value of the measured gain values from each environmental point; similarly, worst-case power is the maximum power. The CART data mining first constructs a set of input-output mappings as follows: the user specifies, e.g., through a user input interface, what "low power", "medium power", and "high power" mean with each according to a range of power values. The equivalent is done for gain. The algorithm of this example calculates yield for each combination of power={low, medium, high} and gain={low, medium, high}. Since CART trees can also have a symbolic value associated with each decision node or output node, such as, e.g., "gain=high", the input samples to the CART model of this example build tuples (defined as a sequence of objects) such as (gain=high, power=medium), with the target output value being yield. The CART builder outputs an example model that realizes the mapping according to the data; an example output is shown in FIG. 3. It is the tree of FIG. 3 that is automatically generated in a visual format by the display system 24.

Following is a further example of the use of the system 10 of the present invention. In this example, the ultimate results presented to the user relate to information about the impact of each device on yield for a given ECD. For the ECD in question, a set of Latin hypercube samples is taken in the joint space of {design variables, random variables, and environmental variables}. Each of these samples can be simulated by the circuit simulator 14 for different analyses, e.g. an AC analysis, a DC analysis, two transient analyses (having different input waveforms and performance measures), and a noise analysis. From each simulation, one or more performance metrics are computed by the circuit simulator 14. Alternatively, the "simulation" can merely be a function as well, such as a calculation of area, which might be as simple as summing up the width*length for each device; or such as user-input equations that are rough mappings of design variables to a particular performance measure. At this stage, the main objective is to gather data points that have the {design variables, random variables, and environmental variables} as inputs and performance metrics as (eventual) outputs. At this point, the data-mining engine 18 is ready to extract circuit simulation data from the database 16. In the present example, the data-mining engine builds regression models to learn the mapping of circuit variables to performance metrics, such as using a bagged CART tree. The constraint on these regression models is that, once formed, there should be a means to extract from it the importance of each circuit variable with respect to a given performance metric. For the purposes of illustration, the present embodiment employs a feedback loop between the data-mining engine 18 and the circuit simulator 14. Each regression model formed by the data-mining engine 14 is simulated on unseen data points to see how good its prediction accuracy is; if its prediction accuracy is not good enough, then the model is flagged. Then, all the analyses that are associated with the flagged regression models have more sampling and simulations applied. The extra sampling performed can include Latin hypercube sampling just like in the first pass, or can be more involved by choosing points in the regression input variable space with the most prediction uncertainty (e.g., if the regression model is a set of CART trees, then the uncertainty can merely be the standard deviation of the difference between each CART's predicted output at a given point). More simulations are done by the circuit simulator 14 on the chosen sample points, the flagged regression models are rebuilt by the data mining engine 18, and the prediction ability is tested again. This feedback loop from 18 back to 14 continues until no regression models get flagged, or some other feedback stopping criteria is met, such as the maximum number of simulations being hit (user-specified), maximum runtime being hit (user-specified), target prediction accuracy is hit for all models (possibly user-specified), or the user has hit a "stop" button.

The above example can be expanded on as follows. Recall that these regression models map {design, random, environmental} variables to metrics, generally with one regression model per metric; however, at the onset of the problem, it was desired to obtain the impact of the design variables on yield for a given EDC. Ultimately, the goal is to create a dataset of design points to yield.

To achieve this goal, Latin hypercube sampling (LHS) is performed in just design variable space (not random or environmental variable space) to create a very large set of design points. For each design point, a large number of Monte Carlo samples are taken in random variable space, and for each Monte Carlo sample, a set of environmental corners are sampled. Each of these {design, random, environmental} samples is "simulated" by the regression models rather than with SPICE. Using SPICE would be extremely computationally expensive, and it is for this reason that a large number of design points and random points may be "simulated". Via aggregation of these samples across environmental points and random points, a yield estimate for each design point is obtained.

Figure 4:
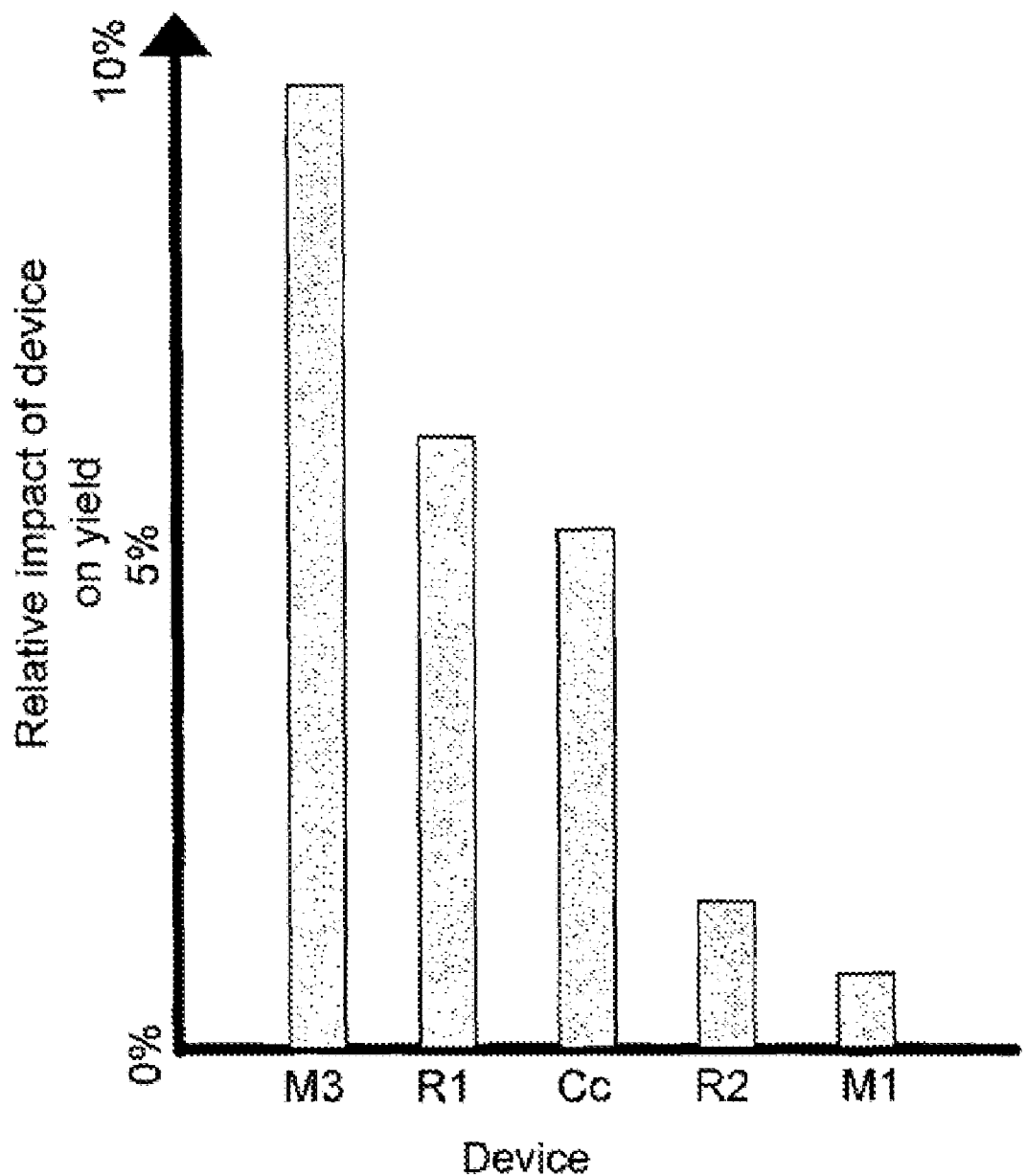
FIG. 4 is a bar graph showing the impact of devices on yield.

Thus, at this point, there is a new set of input/output data, of design points to yield. A regression model is built from this particular data with the regression model mapping design variables to yield, also with the constraint of being able to extract relative impact of variables This is because, as will be shown in the next step, the impact of each design variable on yield is extracted from this regression model. Finally, to obtain the impact of a given EDC component on yield, a summation of the impacts of the design variables of that particular component is carried out. It is this "impact per device on yield" which was the desired result in this example, and which constitutes the insight-enabling data 20. This insight-enabling data 20 is provided to the visualization tool 22, which can provide a variety of views to the display system 24. An example view is that of a bar graph, showing the relative impacts, as illustrated at FIG. 4. In the x-axis is the relative impact, as a percentage of overall impact. In the y-axis, each bar corresponds to a different device (M1 and M3 are transistors, R1 and R2 are resistances and Cc is a (compensation) capacitor. The bar graph can be sorted by device, starting with the highest-impact device. A complementary bar graph (not shown) could show the cumulative impacts of devices, up to 100% impact. The data associated with these types of bar graphs can also be shown in text or table format.

Figure 5:
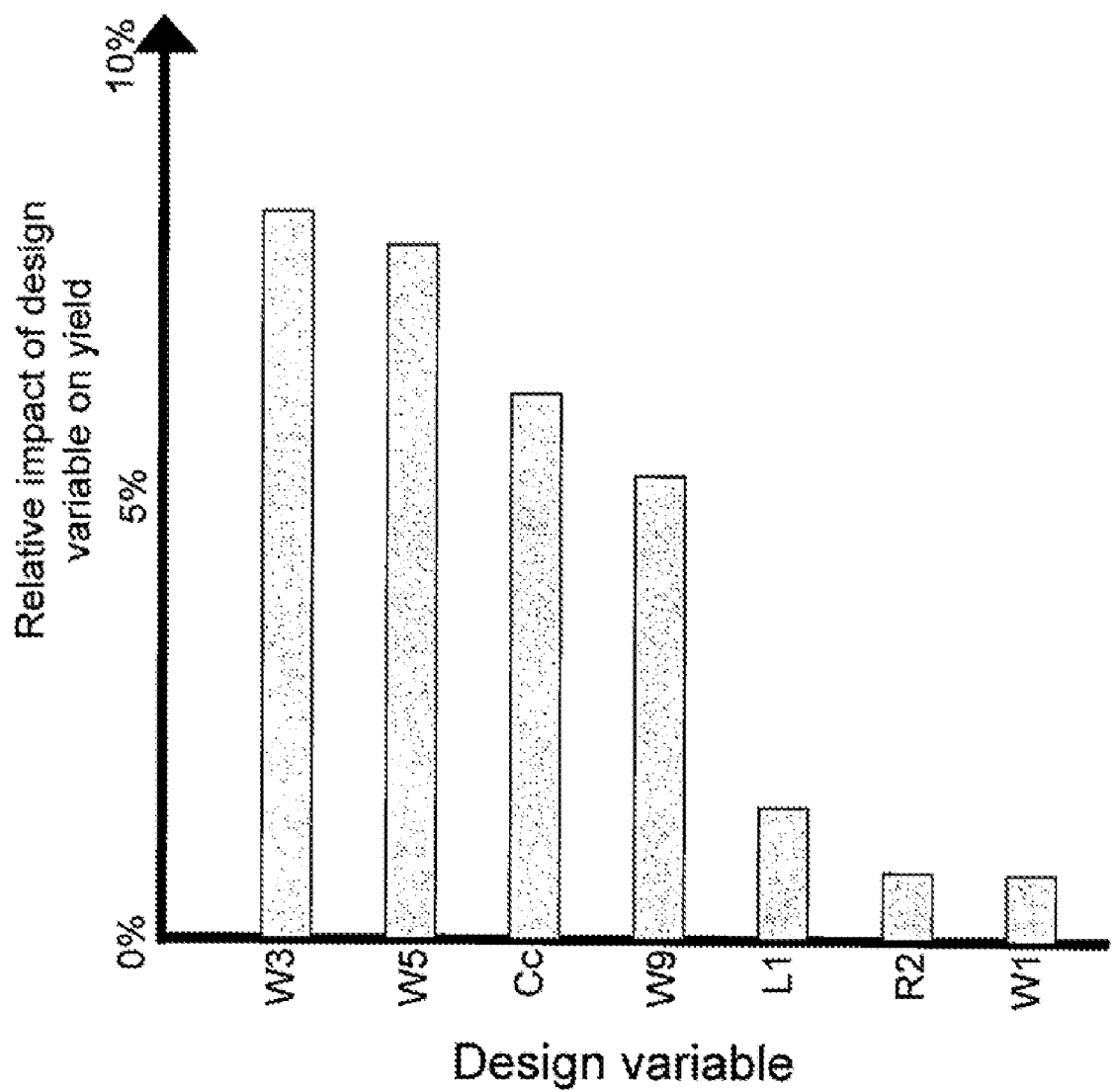
FIG. 5 is a bar graph showing the impact of design variables on yield.
Figure 6:
FIG. 6 shows an exemplary two-dimensional plot of estimated yield vs. design variable.

In addition, it will be apparent to those skilled in the art that other insight-enabling data can be provided to the visualization too, such as, for example, bar charts showing relative impact: per design variable on yield (an example is shown at FIG. 5 where W1, W3, W5 and W9 are widths related to a given circuit's transistors M1, M3, M5 and M9, respectively; R2 is resistance of resistor 2; L1 is length of device; and Cc is a compensation capacitance; per design variable on each performance; per device on each performance; per random variable on performance or on yield; per environmental variable on performance or on yield; and, per environmental point on performance or on yield. Additionally, data that shows the regression models as curves in two-dimensional plots or three-dimensional plots can be shown. A two-dimensional example is as follows. All design variables are fixed, with the exception of one variable that the user has selected. The variable is swept and "simulated" on the regression model that maps design variables to yield and then, a plot of estimated yield vs. the design variable is shown to the user such as shown at FIG. 6 (the design variable is in this case width W2). A three-dimensional example is as follows. A nested loop of two user-selected design variables are swept. Following this, a three-dimensional surface plot is shown to the user. In some embodiments, the user may be able to interact with the plot as well such as rotating, zooming, etc.

The user can also provide feedback to the data-mining engine 18 by selecting, through a user input module (not shown) and display system 24, a sub-region of the design space (e.g., by setting new minimum and maximum values for each design variables, where the minimum is greater than or equal to the original minimum, and the new maximum is less than or equal to the original maximum). The data-mining engine 18 would query its already-existing design-variables-to-yield regression model about the relative impact of design variables in the specified sub-region; it would be summed across devices; and finally the new impact information would be displayed through any suitable representation, e.g., through a bar graph. (Note that this would pose new constraints on the particular regression approach, as not all regression approaches can report relative impact about a sub-region of its original space. One regression approach that can do this is CART trees, or sets of CART trees such as bagged trees.)

In the embodiment just given, it will be apparent to those skilled in the art that it is also possible to change the order of the feedback loops: rather than feeding back directly from data mining to simulation, the visualization is always updated first; only after that point is more simulation and data mining done. This enables the user to monitor progress more readily; and of course enables the user to alter the course of progress if desired.

Many data mining approaches can be broken into the category of either supervised learning or unsupervised learning. In supervised learning, there is a set of input tuples that map to output tuples with a goal directed towards understanding the mapping from one to the other. Thus far, supervised learning as been addressed by mapping inputs like design variables to outputs such as, e.g., yield by using tools such as regression, classification, and extraction of relative impacts. Unsupervised data mining approaches, such as density estimation and clustering, are discussed next.

Figure 7:
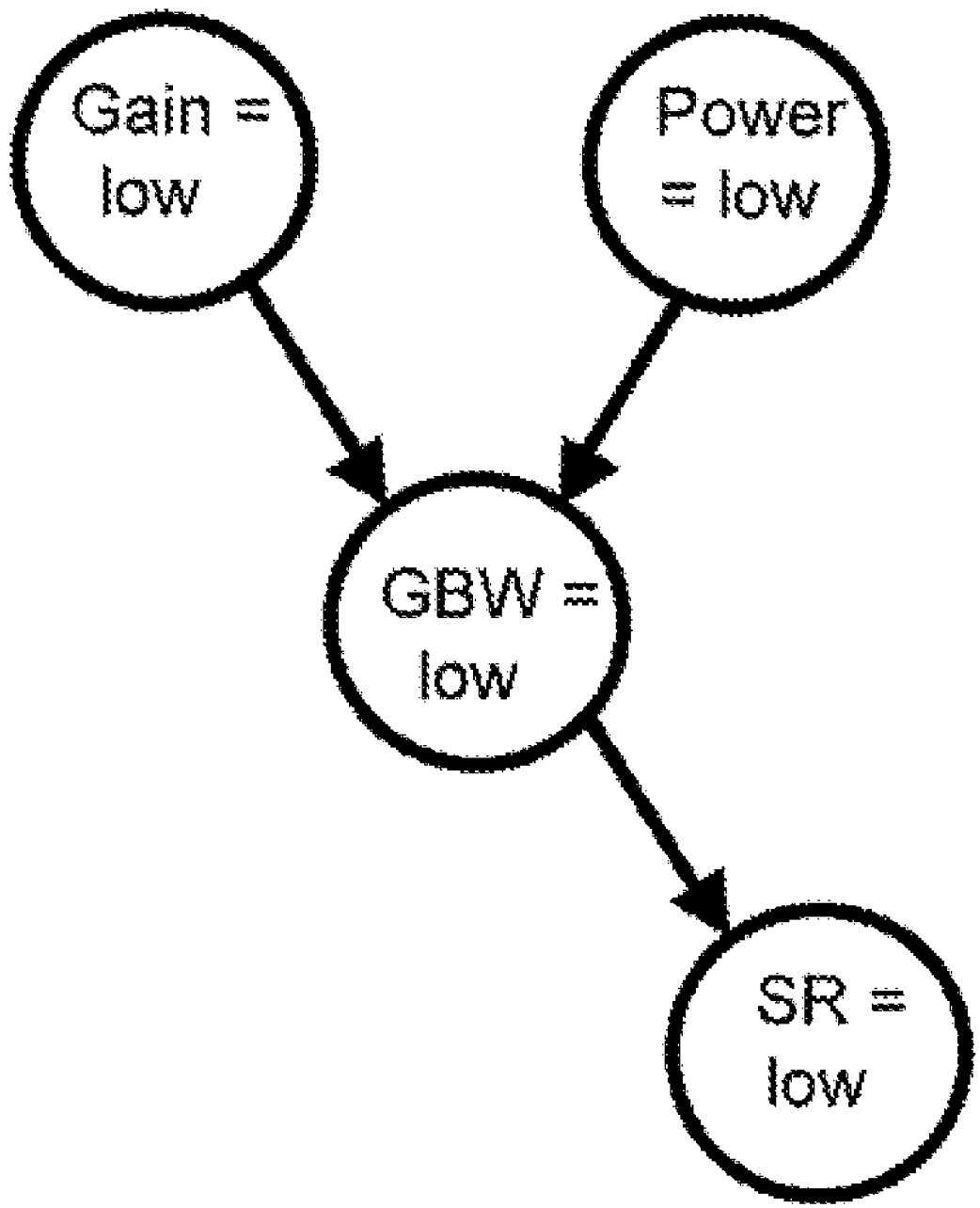
FIG. 7 shows a Bayes net relating performances to each other.

In another embodiment of the present invention, the design point is fixed in the simulation step performed by the circuit simulator 14 and so is the environmental point. Random points are sampled with Monte Carlo sampling; each random point is simulated on one or more analyses (e.g., ac, dc, and transient analyses). Each random point has a corresponding performance vector, i.e., a series of performance values, each attributable to a specific performance parameter. The performance vectors are part of database 16 shown at FIG. 1. Ignoring the random points and only using the set of performance vectors, a Bayes Net is constructed (a Bayes net is an estimate of relative density of points, where the input variables are discrete). Because it is just performance vectors as inputs, and there are no outputs, it is therefore termed unsupervised learning As part of the construction of the Bayes Net, joint dependencies among variables are automatically identified. The Bayes Net would be considered the insight-enabling data 20 shown at FIG. 1. For the visualization tool part in this particular embodiment, the Bayes Net can be depicted graphically where variables are nodes and variable dependencies are directed arcs between nodes. (This is a natural representation for Bayes Nets, which are also termed as "Graphical Models"). shows an exemplary Bayes net. In the example of FIG. 7, the data mining of Bayes Net construction determined that low gain and low power cause low gain-bandwidth product (GBW), and that in turn causes low SR (slew rate).

Figure 8:
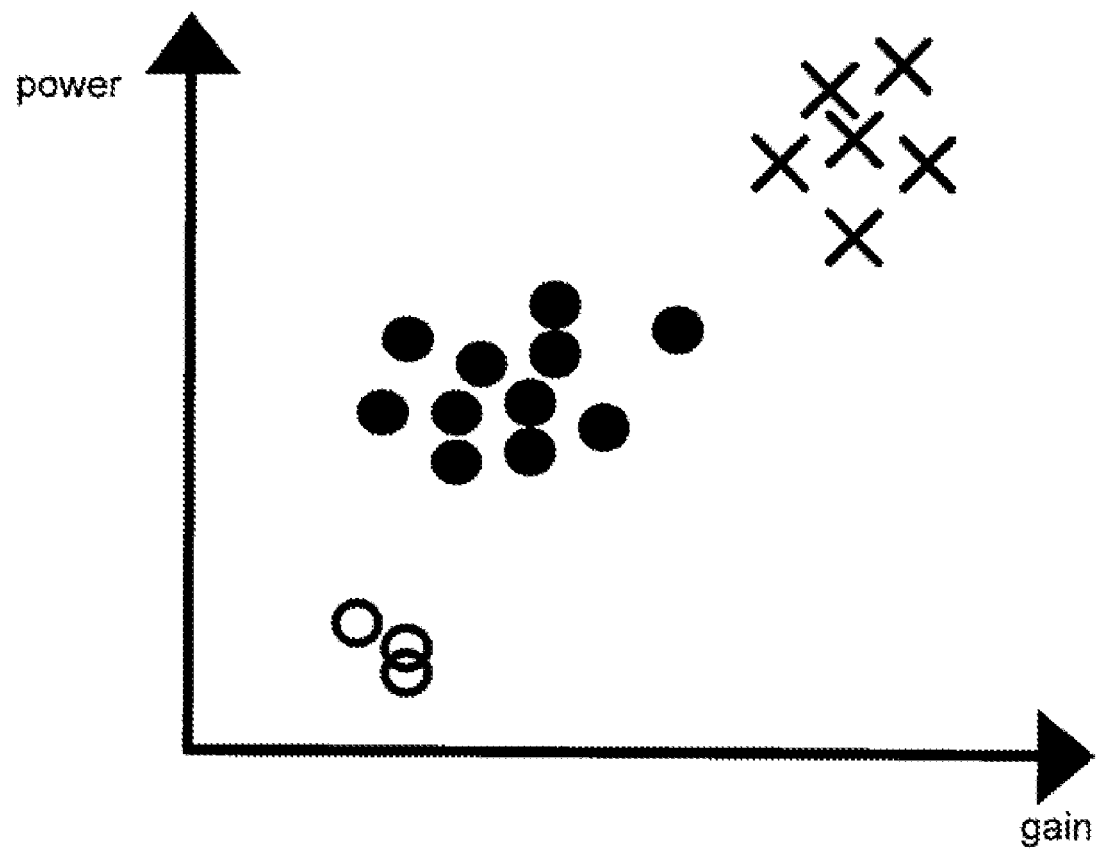
FIG. 8 shows an exemplary outcome of a clustering with two input dimensions.
Figure 9:
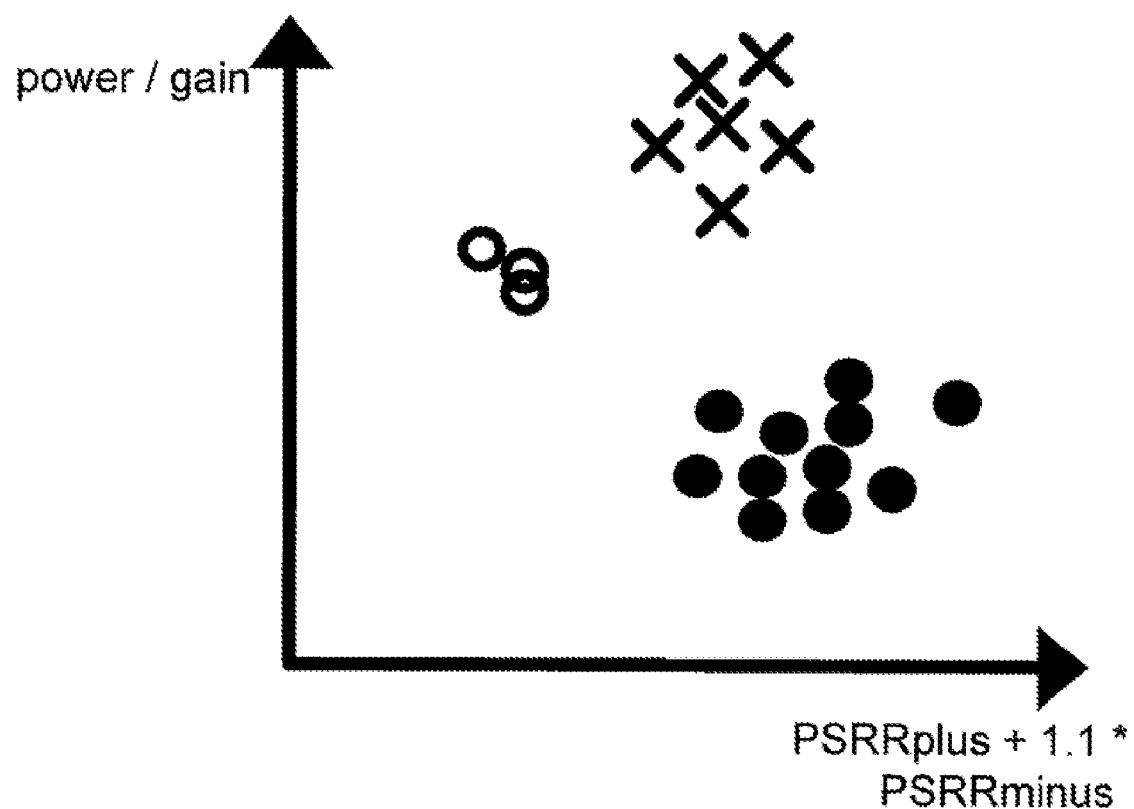
FIG. 9 shows an exemplary outcome of a clustering using nonlinear dimensionality reduction to get two final dimensions.
Figure 10:
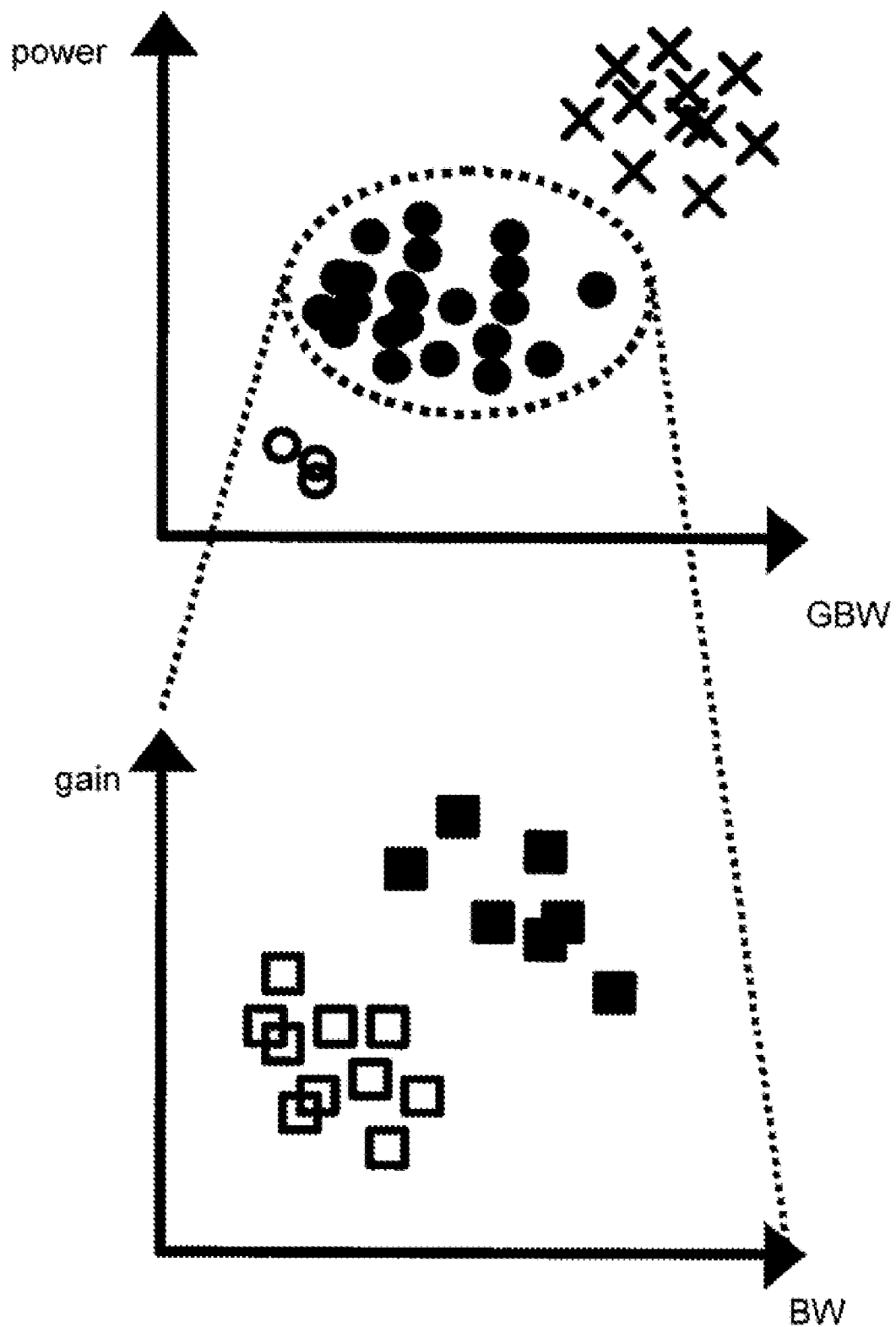
FIG. 10 shows an exemplary outcome of a hierarchical clustering.

Another embodiment can have the same simulation data as the Bayes Net example, but instead of building a Bayes Net, one could apply a clustering algorithm to do a different sort of unsupervised learning. The goal of clustering algorithms in general is to identify groups of points ("clusters"), where within the cluster the points are close together according to some distance metric, and the distance between points in two different clusters is comparatively higher. This is useful in general because it can identify if natural classes arise for a given input dataset and if any trends emerge, and what they might be. Such a task is easy for a user to do with points in two-dimensional or three-dimensional space, but not in higher-dimensional spaces. In the present embodiment, the dimensions of the input space are performances such as gain and power consumption, and the distance measure is simply Euclidian distance. The input to the clustering algorithm is merely the set of (power, gain) points; and the algorithm identifies the clusters. An example of an output of a clustering algorithm is shown in FIG. 8. Here the three different clusters are identified by the filled-in 'o', the non-filled 'o', and the 'x'. For visualizing the clusters, there are many approaches. For example one could perform dimensionality reduction to get the clusters into two or three dimensions, as shown in the example of FIG. 9 where new axes' dimensions are created; the new dimensions are nonlinear combinations of input variable axes (PSRRplus and PSRRminus are the positive and negative power-supply rejection ratios, respectively). Or, one could use a hierarchical clustering algorithm in combination with a hierarchical cluster-traversal visualization tool to produce a graph such as shown, for example, at FIG. 10. At FIG. 10, the top graph is the highest group of clusters, which has done a rough divide of the data into three top-level clusters using the input dimensions of power and GBW. The user can choose to dive to deeper levels of some clusters, which may further subdivide the cluster; in this case the cluster with the filled o's can be recursed into another two-dimensional set of clusters in which the axes of gain and BW provide further clustering. The learning side of the clustering-based insight tools would be included in the data mining engine 18, then used with the visualization tool 22).

As the general flow of FIG. 1 implies, the exemplary embodiments just given can be combined in various fashions. For example, from the same simulation data, one could build the Bayes Net and do the clustering, then provide visualizations for both. Or in a more advanced flow, one might build the regression models, which map {design, random, environmental} variables to each performance metric. Then, one could generate a large set of performance vectors on these regressor models, and build the Bayes Net and cluster information from that.

Figure 11:
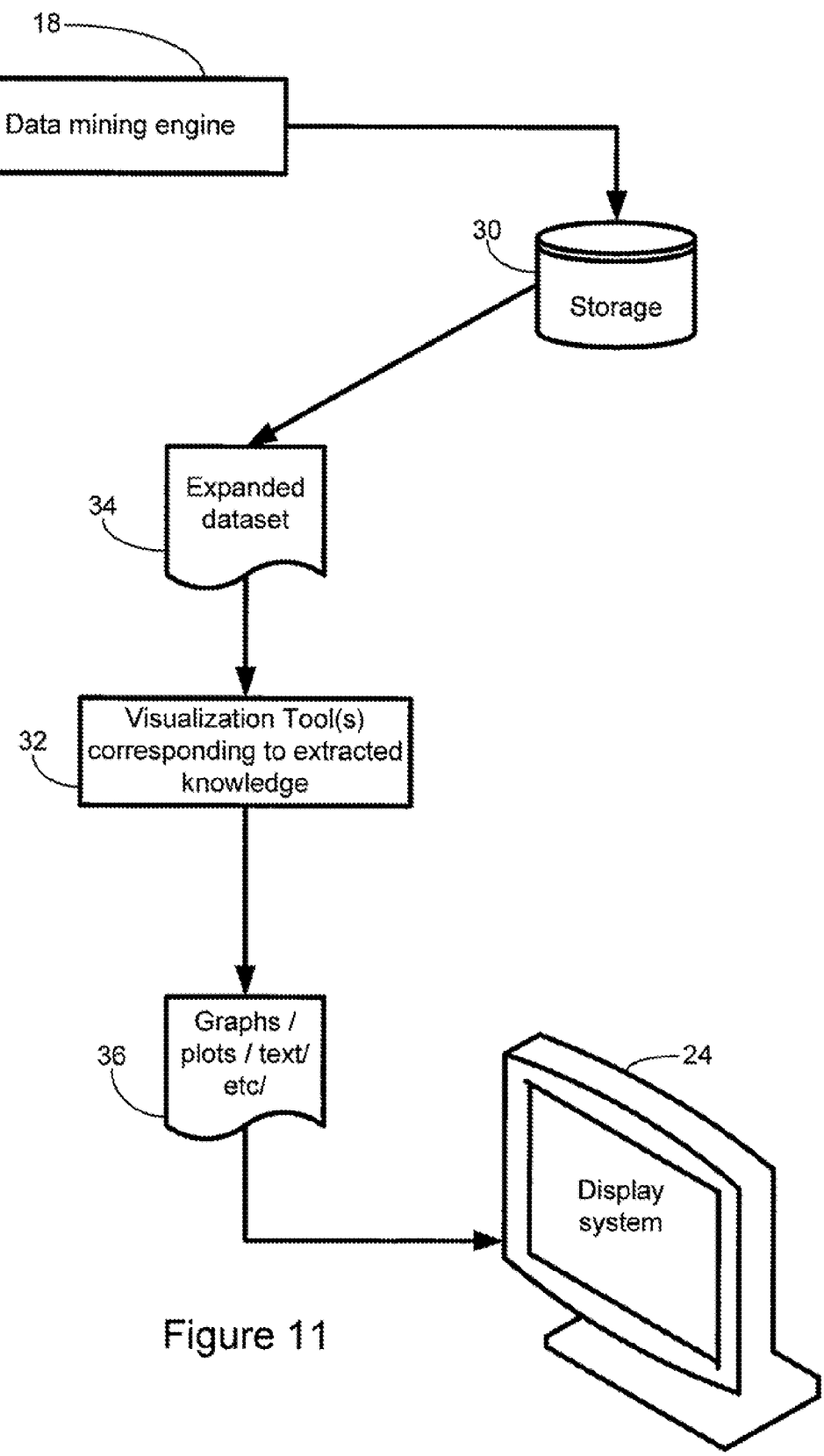
FIG. 11 is a plot showing an example of usage of the data-mining-extracted information; once that information exists the other steps in the flow do not need to be repeated.

FIG. 11 illustrates an extra benefit/use case enabled due to the storage of data-mining-extracted knowledge (insight-enabling data 20). The simulation is usually computationally intensive and time-consuming, and it takes some degree of designer effort to configure the initial simulation setup. Thus, the data extracted by the data-mining engine 18 can be stored for future use in a storage medium 30, either alone or in conjunction with other extracted knowledge. By using appropriate visualization tools 32, it does not take much human expertise, human, or computational effort to visualize the expanded database 34 by generating various graphs/plots/text 36 to be displayed by the display system 24. This means that multiple users can visualize a database created by a single user, possibly a more expert user (typically the analog designer). The database 34 can be readily copied, or made available on a network. Some examples of other visualization-only users can include: layout designers who want to understand the relative impact of devices on performance and yield; process engineers who want to understand the relative impact of random process variables on yield; design engineers who are trying to migrate an older design and want quick insight into what devices are important; managers who want more visibility into the big picture. With a tool that can be used by so many users, it has an even more general use case: to strengthen the communication link between different stakeholders in the chip design flow.

Figure 12:
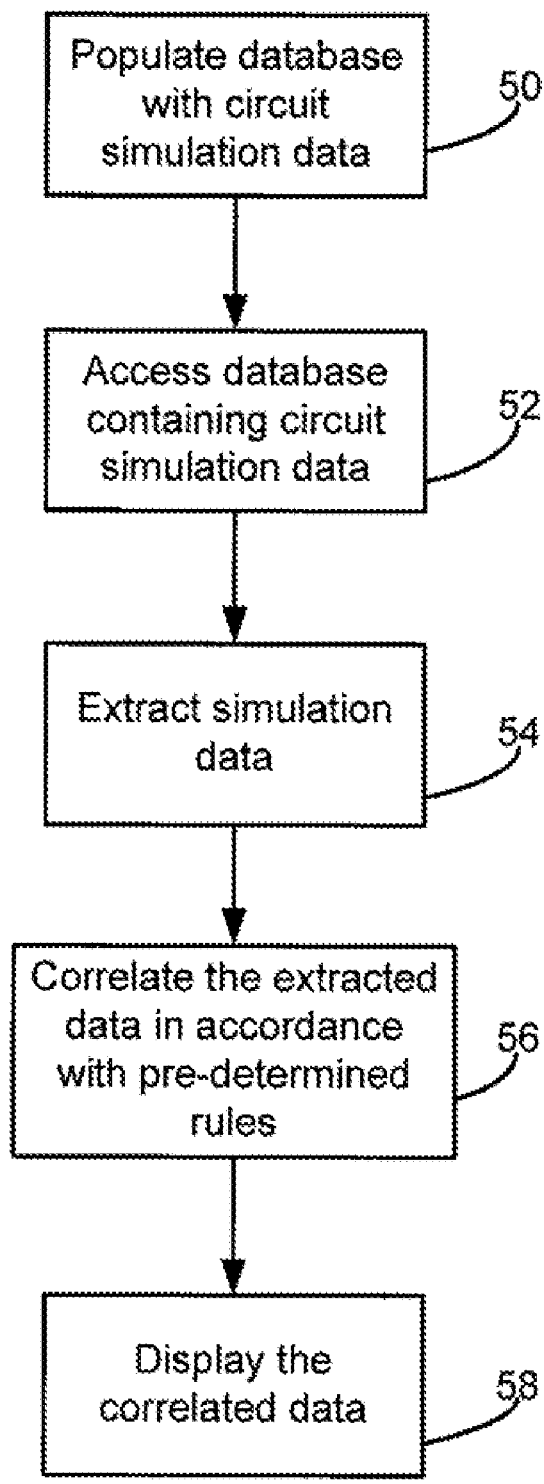
FIG. 12 shows a flowchart of a method of the present invention.

FIG. 12 illustrates an example of a method of the present invention. At step 50, a database is populated with circuit simulation data generated by, for example, the circuit simulator of FIG. 1. At step 42, the database, populated at step 50, is accessed by a data-mining engine such as, for example, the data-mining engine 18 of FIG. 1. Following this, data is extracted from the database at step 54, for example by the data-mining engine 18, and is correlated in accordance with pre-determined rules at step 56. The correlation and its related rules can be of the type described above with respect to the system 10 of FIG. 1, or can be of any other suitable type. Finally, at step 58, the insight-enabling data is displayed to a user.

As described above, the present invention provides a method and system for creating a set of circuit simulation data, from which insight-enabling data can be extracted using data mining techniques. The insight-enabling data is organized and presented to the designer to help him guide design choices.

Embodiments of the invention may be represented as a software product stored in a machine-readable medium (also referred to as a computer-readable medium, a processor-readable medium, or a computer usable medium having a computer readable program code embodied therein). The machine-readable medium may be any suitable tangible medium, including magnetic, optical, or electrical storage medium including a diskette, compact disk read only memory (CD-ROM), memory device (volatile or non-volatile), or similar storage mechanism. The machine-readable medium may contain various sets of instructions, code sequences, configuration information, or other data, which, when executed, cause a processor to perform steps in a method according to an embodiment of the invention. Those of ordinary skill in the art will appreciate that other instructions and operations necessary to implement the described invention may also be stored on the machine-readable medium. Software running from the machine readable medium may interface with circuitry to perform the described tasks.

The above-described embodiments of the present invention are intended to be examples only. Alterations, modifications and variations may be effected to the particular embodiments by those of skill in the art without departing from the scope of the invention, which is defined solely by the claims appended hereto.

What is claimed is:

1. A tangible computer-readable medium having recorded thereon statements and instructions for execution by a computer of a method for visualizing data associated with an electrical circuit design (ECD), the ECD having associated therewith circuit design variables and circuit performance metrics, the method comprising steps of:
   accessing a database containing circuit simulation data of the ECD, the circuit simulation data including circuit design variables data and circuit performance metrics data;
   extracting circuit simulation data to obtain extracted data;
   processing the extracted data in accordance with a pre-determined data-mining algorithm to obtain output data, the output data correlating at least one of:
   (a) a design variable to a circuit performance metric; and
   (b) a first performance metric to a second performance metric;
   organizing the output data in accordance with pre-determined display criteria to obtain organized data; and
   displaying the organized data;
   wherein processing the extracted data includes forming a classification and regression tree (CART), the CART mapping at least one circuit variable to one of the circuit performance metrics.

2. The tangible computer-readable of claim 1 wherein the step of accessing the database is preceded with a step of populating the database.

3. The tangible computer-readable of claim 2 wherein the step of populating the database is performed using SPICE simulation of the ECD.

4. The tangible computer-readable of claim 2 wherein the step of populating the database includes simulating the ECD by using Latin hypercube samples of a design variable space of the ECD.

5. A tangible computer-readable medium having recorded thereon statements and instructions for execution by a computer of a method for visualizing data associated with an electrical circuit design (ECD), the ECD having associated therewith circuit design variables and circuit performance metrics, the method comprising steps of:
   accessing a database containing circuit simulation data of the ECD, the circuit simulation data including circuit design variables data and circuit performance metrics data;

extracting circuit simulation data to obtain extracted data;

processing the extracted data in accordance with a pre-determined data-mining algorithm to obtain output data, the output data correlating at least one of:

(a) a design variable to a circuit performance metric; and (b) a first performance metric to a second performance metric;

organizing the output data in accordance with pre-determined display criteria to obtain organized data; and displaying the organized data;

wherein the step of processing the extracted data includes a step of building a regression model representing a circuit performance metric as a function of at least one circuit variable.

6. The tangible computer-readable of claim 5 wherein the step of building a regression model is followed by steps of:

selecting input data from the circuit variables data to obtain input data;

inputting the input data into the regression model to obtain an output of the regression model; and comparing the output of the regression model to circuit performance metrics data associated with the input data, to obtain a comparison value.

7. The tangible computer-readable of claim 6 wherein if the comparison value is outside a pre-determined range, the steps of selecting input data, inputting the input data and comparing the output are followed by a step of modifying the regression model in accordance with the comparison value, and are repeated until the comparison value is within the pre-determined range.

8. The tangible computer-readable of claim 5 wherein processing the extracted data includes performing a step of clustering the extracted data according to a pre-determined distance metric criteria.

9. The tangible computer-readable of claim 5 wherein processing the extracted data includes forming at least one of a set of classification and regression trees (CARTs) and a Bayes network.

10. A system for visualizing data associated with an electrical circuit design (ECD), the ECD having circuit variables and circuit performance metrics, the system comprising:

a database containing circuit simulation data of the ECD, the circuit simulation data including circuit variables data and circuit performance metrics data;

a data-mining engine for extracting circuit simulation data to obtain extracted data and to process the extracted data in accordance with a pre-determined data-mining algorithm to obtain output data, said data mining engine configured to process the extracted data by building a regression model representing a circuit performance metric as a function of at least one circuit variable such that the output data correlating at least one of (a) a design variable to a circuit performance metric, and (b) a first performance metric to a second performance metric;

a visualization tool for organizing the output data in accordance with pre-determined display criteria to obtain organized data; and a display system for displaying the organized data.

11. The system as claimed in claim 10 wherein said data mining engine if further configured to process the extracted data by forming a classification and regression tree (CART), the CART mapping at least one circuit variable to one of the circuit performance metrics.

* * * * *